(12) United States Patent
Tsai et al.

(10) Patent No.: US 8,305,182 B1
(45) Date of Patent: Nov. 6, 2012

(54) SYMMETRIC DIFFERENTIAL INDUCTOR STRUCTURE

(75) Inventors: Ming-Fan Tsai, Taichung (TW); Kuan-Yu Chen, Taichung (TW); Bo-Shiang Fang, Tantzu (TW); Hsin-Hung Lee, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 13/243,138

(22) Filed: Sep. 23, 2011

(30) Foreign Application Priority Data

May 23, 2011 (TW) .............................. 100117907 A

(51) Int. Cl.
*H01F 5/00* (2006.01)
*H01F 27/28* (2006.01)

(52) U.S. Cl. ......... 336/200; 336/225; 336/226; 336/232

(58) Field of Classification Search .................. 336/200, 336/225, 226, 232
See application file for complete search history.

(56) References Cited

U.S. PATENT DOCUMENTS

| | | | | |
|---|---|---|---|---|
| 5,376,774 A | * | 12/1994 | McGaffigan et al. | ......... 219/624 |
| 5,420,558 A | * | 5/1995 | Ito et al. | ......................... 336/200 |
| 7,221,251 B2 | * | 5/2007 | Menegoli et al. | ............. 336/200 |
| 2006/0220778 A1 | * | 10/2006 | Marques | ....................... 336/225 |

FOREIGN PATENT DOCUMENTS

WO WO 9805048 A1 * 2/1998

* cited by examiner

*Primary Examiner* — Mohamad Musleh
*Assistant Examiner* — Tsz Chan
(74) *Attorney, Agent, or Firm* — Peter F. Corless; Steven M. Jensen; Edwards Wildman Palmer LLP

(57) ABSTRACT

A symmetric differential inductor structure includes first, second, third and fourth spiral conductive wirings disposed in four quadrants of a substrate, respectively. Further, a fifth conductive wiring connects the first and fourth spiral conductive wirings, and a sixth conductive wiring connects the second and third spiral conductive wirings. The first and second spiral conductive wirings are symmetric but not intersected with one another, and the third and fourth spiral conductive wirings are symmetric but not intersected with one another. Therefore, the invention attains full geometric symmetry to avoid using conductive wirings that occupy a large area of the substrate as in the prior art and to thereby increase the product profit and yield.

9 Claims, 6 Drawing Sheets

SYMMETRIC DIFFERENTIAL INDUCTOR STRUCTURE

CROSS-REFERENCES TO RELATED APPLICATIONS

This application claims under 35 U.S.C. §119(a) the benefit of Taiwanese Application No. 100117907, filed May 23, 2011, the entire contents of which is incorporated herein by reference.

BACKGROUND OF THE INVENTION

1. Field of the Invention

The present invention relates to inductor structures, and, more particularly, to a symmetric differential inductor structure.

2. Description of Related Art

In the field of semiconductor fabrication processes, differential inductors are important passive components. Generally, there are two types of differential inductors: symmetric differential inductors and center-tap differential inductors.

FIG. 1A shows a symmetric differential inductor 1. Referring to FIG. 1A, the symmetric differential inductor 1 has a T-shaped central conductive wiring 10 disposed in the center of a substrate, a first conductive wiring 11 extending from the left side of the central conductive wiring 10 in a counterclockwise spiral (moving outwards from the center), and a second conductive wiring 12 extending from the right side of the central conductive wiring 10 in a clockwise spiral. One end of the first conductive wiring 11 has a first input port 110 and the other end of the first conductive wiring 11 has a contact 111 connected to the left side of the central conductive wiring 10. One end of the second conductive wiring 12 has a second input port 120 and the other end of the second conductive wiring 12 has a contact 121 connected to the right side of the central conductive wiring 10. FIG. 1B shows characteristic curves and quality factors of the symmetric differential inductor 1.

FIG. 2A shows a center-tap differential inductor 2. Referring to FIG. 2A, the center-tap differential inductor 2 has a central conductive wiring 20, a first spiral conductive wiring 21 and a second spiral conductive wiring 22. One end of the first spiral conductive wiring 21 has a first input port 210 and the other end of the first spiral conductive wiring 21 has a contact 211 connected with the central conductive wiring 20. One end of the second spiral conductive wiring 22 has a second input port 220 and the other end of the second conductive wiring 22 has a contact 221 connected to the central conductive wiring 20. The first spiral conductive wiring 21 has a third conductive wiring section 23 extending across the second spiral conductive wiring 22, and the second spiral conductive wiring 22 has a fourth conductive wiring section 24 extending across the first spiral conductive wiring 22. FIG. 2B shows characteristic curves and quality factors of the center-tap differential inductor 2.

However, the T-shaped central conductive wiring 10 of the symmetric differential inductor 1 and the central conductive wiring 20 of the center-tap differential inductor 2 occupy a large area of the substrate, thereby decreasing the product profit. Further, it is not possible to attain a fully symmetric structure due to the intersections of the spiral conductive wirings in the center-tap differential inductor 2. As such, phase differences or other interference could occur and adversely affect the product yield and even seriously affect the inductance values and quality factors of the inductor.

Therefore, it is imperative to provide a differential inductor structure different from the conventional symmetric or center-tap differential inductors so as to overcome the above-described drawbacks.

SUMMARY OF THE INVENTION

Accordingly, the present invention provides a symmetric differential inductor structure disposed on a substrate, wherein the substrate is divided into a first quadrant, a second quadrant, a third quadrant and a fourth quadrant, and wherein a first input port is disposed in the second quadrant, a second input port is disposed in the first quadrant and a third input port is disposed outside the first and second quadrants. The symmetric differential inductor structure comprises: a first spiral conductive wiring disposed in the second quadrant and having a first contact connected to the first input port and a first end disposed in the first spiral conductive wiring; a second spiral conductive wiring disposed in the first quadrant and having a second contact connected to the second input port and a second end disposed in the second spiral conductive wiring; a third spiral conductive wiring disposed in the fourth quadrant and having a third contact connected to the third input port and a third end disposed in the third spiral conductive wiring; a fourth spiral conductive wiring disposed in the third quadrant and having a fourth contact connected to the third input port and a fourth end disposed in the fourth spiral conductive wiring; a fifth conductive wiring disposed over the first and fourth spiral conductive wirings for connecting the first and fourth ends; and a sixth conductive wiring disposed over the second and third spiral conductive wirings for connecting the second and third ends.

According to the present invention, the first and second spiral conductive wirings are symmetric but not intersected with one another, and the third and fourth spiral conductive wirings are symmetric but not intersected with one another, thus attaining full geometric symmetry to avoid using central conductive wirings that occupy a large area of the substrate as in the prior art and to thereby increase the product profit and yield.

DETAILED DESCRIPTION OF PREFERRED EMBODIMENTS

The following illustrative embodiments are provided to illustrate the disclosure of the present invention and its advantages, these and other advantages and effects being apparent to those in the art after reading this specification.

Figure 3A:
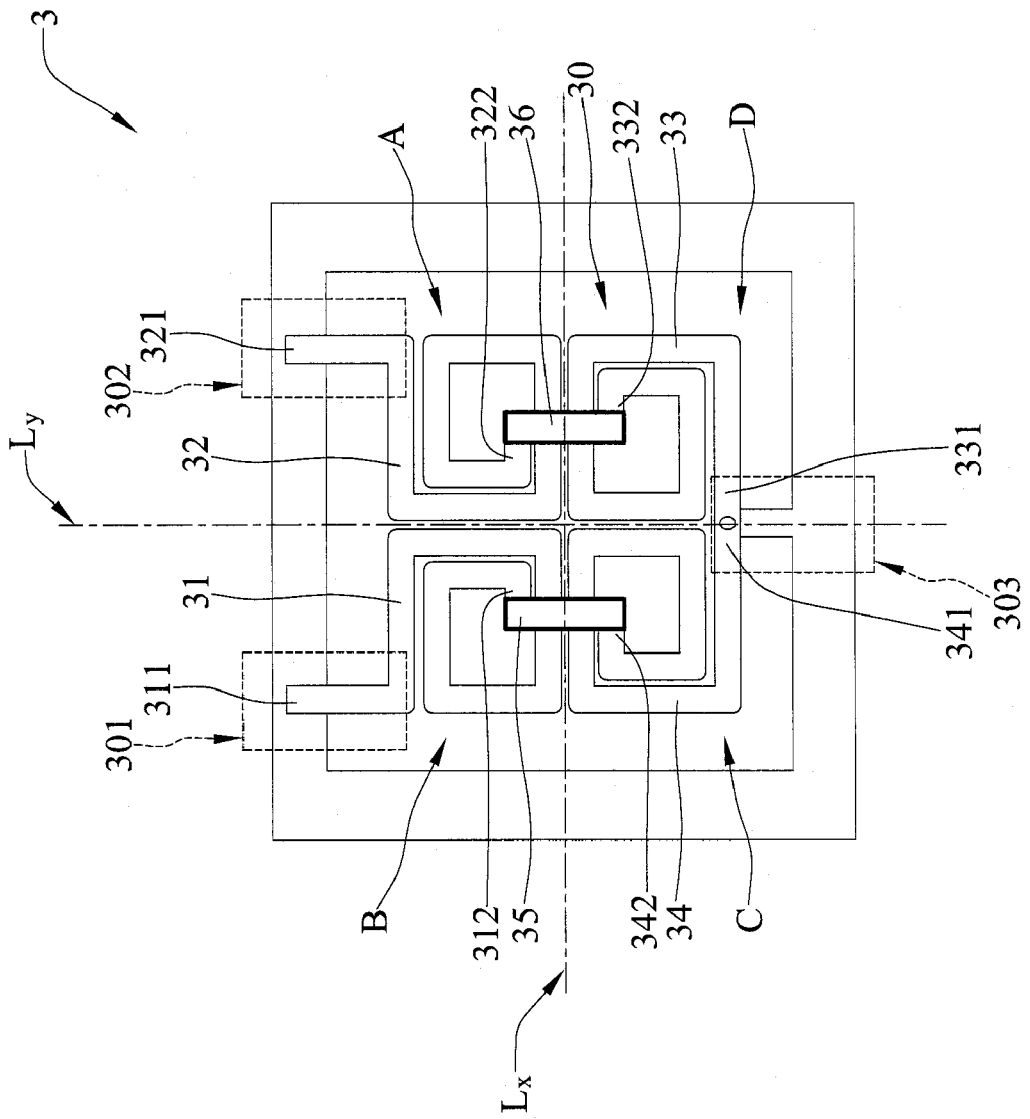
FIG. 3A is a structural diagram of a symmetric differential inductor of the present invention.

FIG. 3A shows a symmetric differential inductor structure according to the present invention. Referring to FIG. 3A, the symmetric differential inductor 3 is disposed on a substrate 30 and has a first spiral conductive wiring 31, a second spiral conductive wiring 32, a third spiral conductive wiring 33, a fourth spiral conductive wiring 34, a fifth conductive wiring 35 and a sixth conductive wiring 36.

The substrate 30 is divided into a first quadrant A, a second quadrant B, a third quadrant C and a fourth quadrant D by centerlines Lx, Ly. The substrate 30 further has a first input port 301 disposed in the second quadrant B, a second input port 302 disposed in the first quadrant region A and a third input port 303 disposed outside the first quadrant region A and the second quadrant region B. For example, the third input port 303 can be disposed on the centerline Ly between the third quadrant C and the fourth quadrant D of the substrate 30.

The first spiral conductive wiring 31 is spirally disposed in the second quadrant B of the substrate 30 and has a first contact 311 connected to the first input port 301 and a first end 312 disposed in the first spiral conductive wiring 31 at a position distant from the first input port 301.

The second spiral conductive wiring 32 is spirally disposed in the first quadrant A of the substrate 30 and has a second contact 321 connected to the second input port 302 and a second end 322 disposed in the second spiral conductive wiring 32 at a position distant from the second input port 302. The first and second spiral conductive wirings 31, 32 are symmetric to each other along the centerline Ly.

The third spiral conductive wiring 33 is spirally disposed in the fourth quadrant D of the substrate 30 and has a third contact 331 connected to the third input port 303 and a third end 332 disposed in the third spiral conductive wiring 33 at a position distant from the third input port 303.

The fourth spiral conductive wiring 34 is spirally disposed in the third quadrant C of the substrate 30 and has a fourth contact 341 connected to the third input port 303 and a fourth end 342 disposed in the fourth spiral conductive wiring 34 at a position distant from the third input port 303. The third and fourth spiral conductive wirings 33, 34 are symmetric to each other along the centerline Ly.

The first to fourth spiral conductive wirings 31, 32, 33, 34 can be made of metal or other conductive materials. Further, each of the spiral conductive wirings can be provided with rounded corners so as to avoid excessive accumulation of charges in the conductive wiring, thereby effectively reducing the resistance value of the conductive wiring and increasing the quality factor of the overall product.

The fifth conductive wiring 35 is disposed over the first spiral conductive wiring 31 and the fourth spiral conductive wiring 34 for connecting the first end 312 of the first spiral conductive wiring 31 with the fourth end 342 of the fourth spiral conductive wiring 34.

The sixth conductive wiring 36 is disposed over the second spiral conductive wiring 32 and the third spiral conductive wiring 33 for connecting the second end 322 of the second spiral conductive wiring 32 with the third end 332 of the third spiral conductive wiring 33. The fifth and sixth conductive wirings 35, 36 can be made of metal or other conductive materials.

In the present embodiment, the first spiral conductive wiring 31 extends from the first input port 301 to the first end 312 in a clockwise spiral so as to be spirally disposed in the second quadrant B of the substrate 30. The second spiral conductive wiring 32 extends from the second input port 302 to the second end 322 in a counterclockwise spiral so as to be spirally disposed in the first quadrant A of the substrate 30. Thereby, the first spiral conductive wiring 31 and the second spiral conductive wiring 32 are disposed on both sides of the centerline Ly and symmetric to each other.

Further, the third spiral conductive wiring 33 extends from the third input port 303 to the third end 332 in an anti-clockwise spiral so as to be spirally disposed in the fourth quadrant D of the substrate 30, and the fourth spiral conductive wiring 34 extends from the third input port 303 to the fourth end 342 in a clockwise spiral so as to be spirally disposed in the third quadrant C of the substrate 30. As such, the third spiral conductive wiring 33 and the fourth spiral conductive wiring 34 are also disposed on both sides of the centerline Ly and symmetric to each other.

The third contact 331 of the third spiral conductive wiring 33 connects with the fourth contact 341 of the fourth spiral conductive wiring 34 through the third input port 303.

Furthermore, the second quadrant B for disposing the first spiral conductive wiring 31 can be located on the left side of the centerline Ly and on the upper side of the centerline Lx. The first quadrant A for disposing the second spiral conductive wiring 32 can be located on the right side of the centerline Ly and on the upper side of the centerline Lx. The fourth quadrant D for disposing the third spiral conductive wiring 33 can be located on the right side of the centerline Ly and on the lower side of the centerline Lx. The third quadrant C for disposing the fourth spiral conductive wiring 34 can be located on the left side of the centerline Ly and on the lower side of the centerline Lx. Since the first to fourth quadrants A to D do not overlap each other, the first to fourth spiral conductive wirings 31 to 34 disposed in the four quadrants, respectively, do not overlap each other, thereby avoiding generation of phase differences or other interference that could otherwise adversely affect the product yield.

Figure 1A:
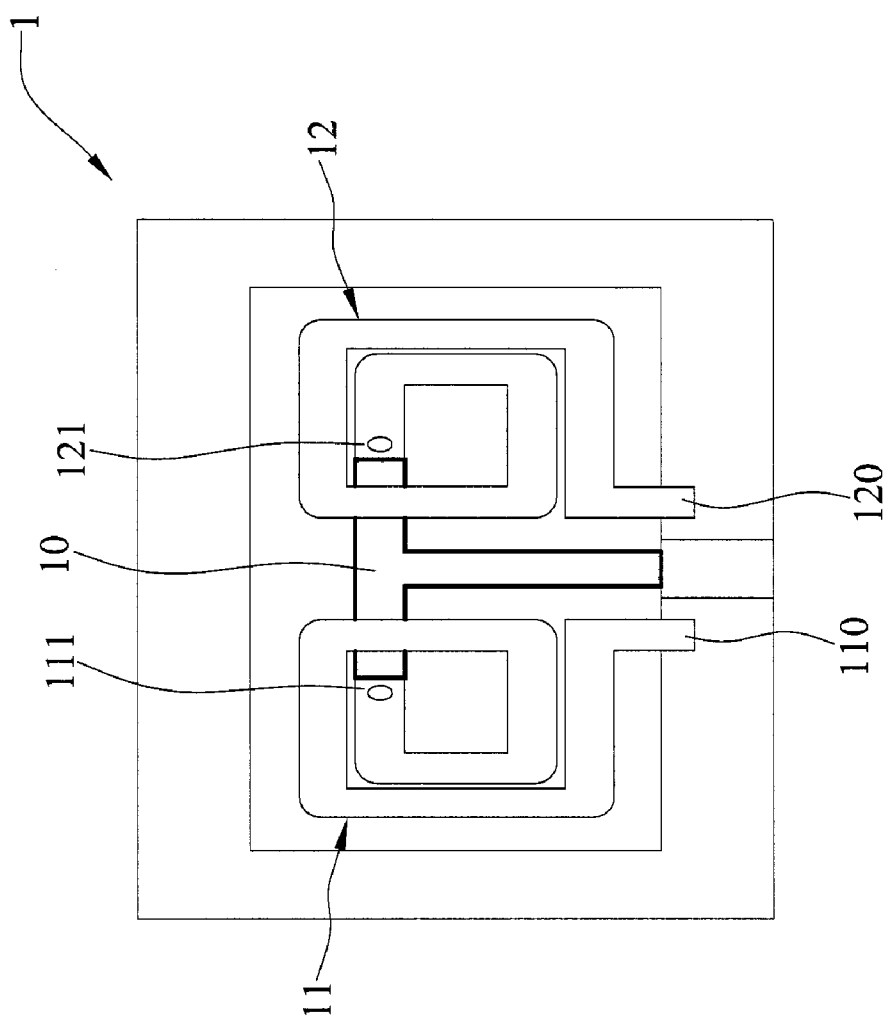
FIG. 1A is a structural diagram of a conventional symmetric differential inductor.
Figure 1B:
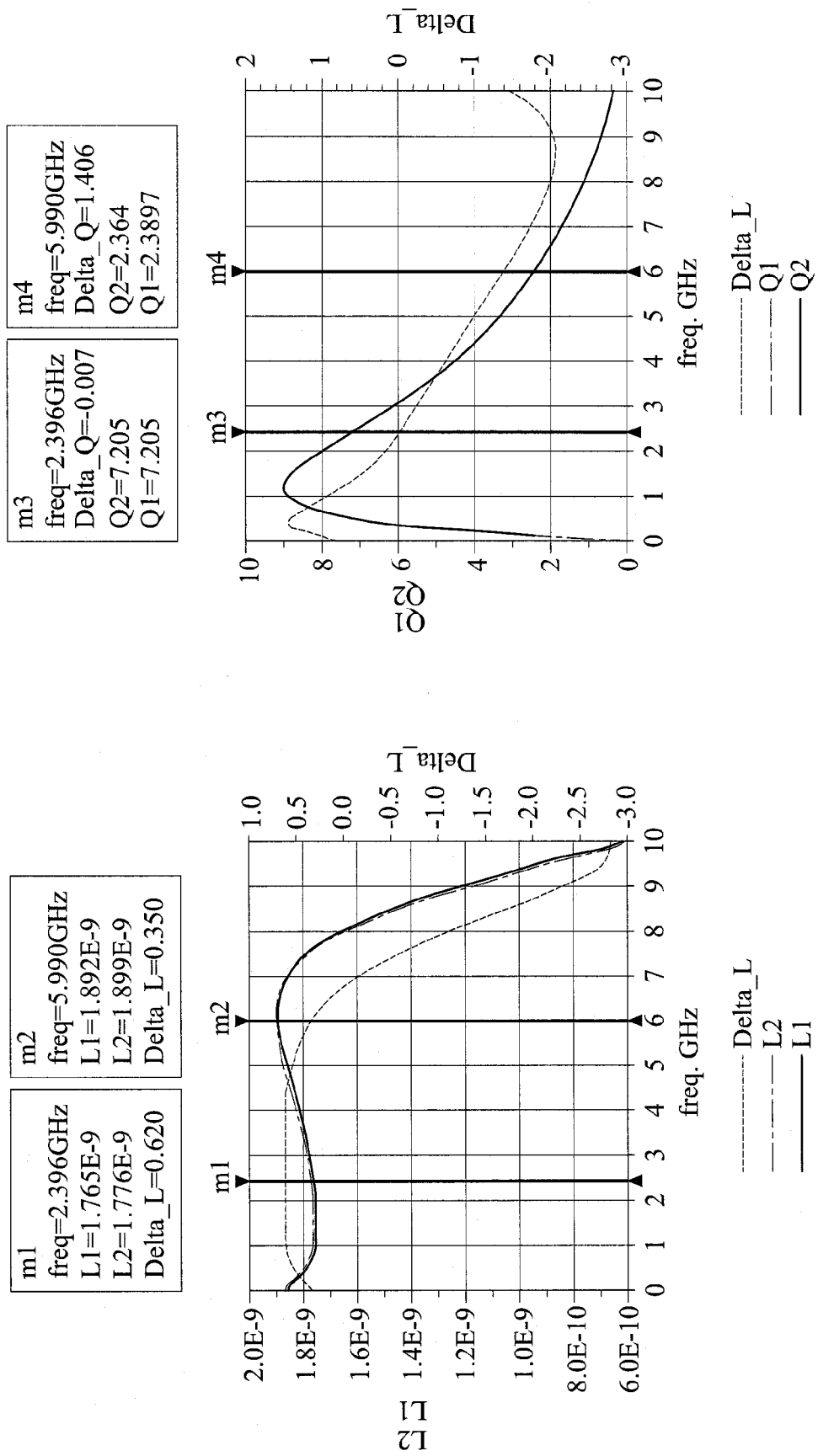
FIG. 1B shows characteristic curves of the symmetric differential inductor of FIG. 1A.
Figure 2A:
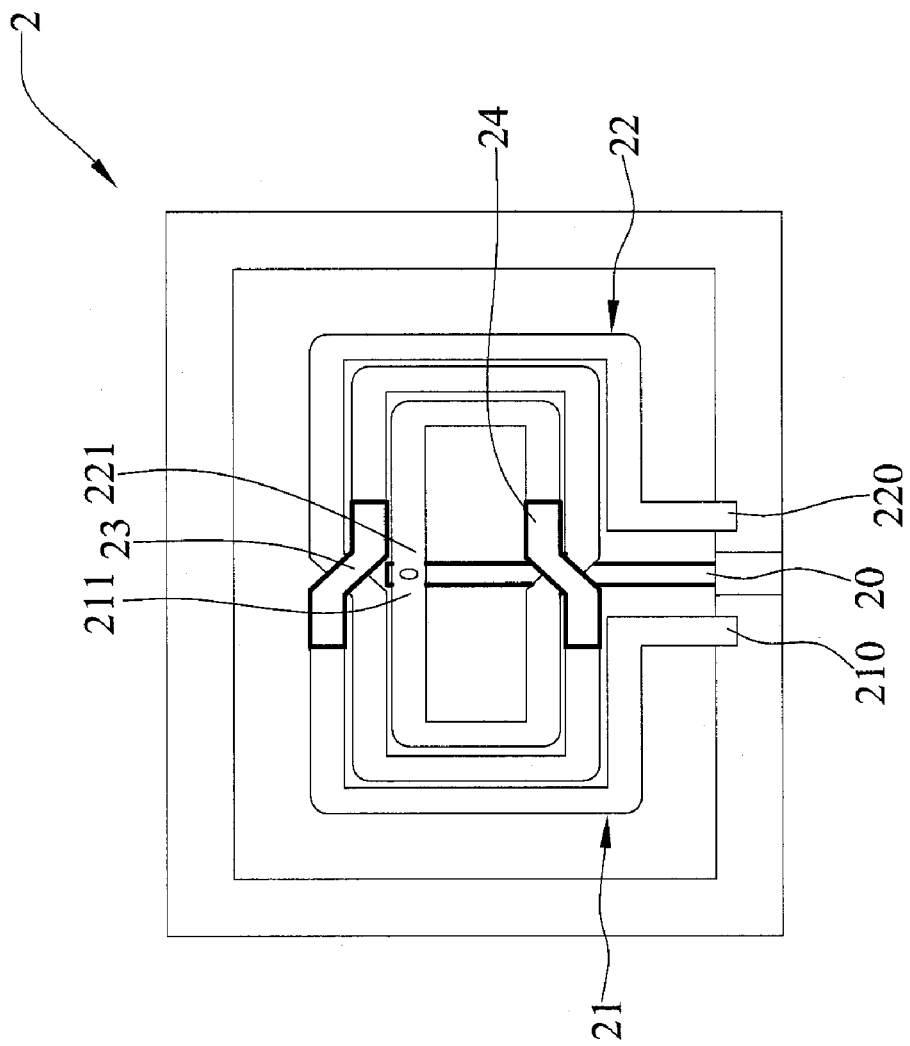
FIG. 2A is a structural diagram of a conventional center-tap differential inductor.
Figure 2B:
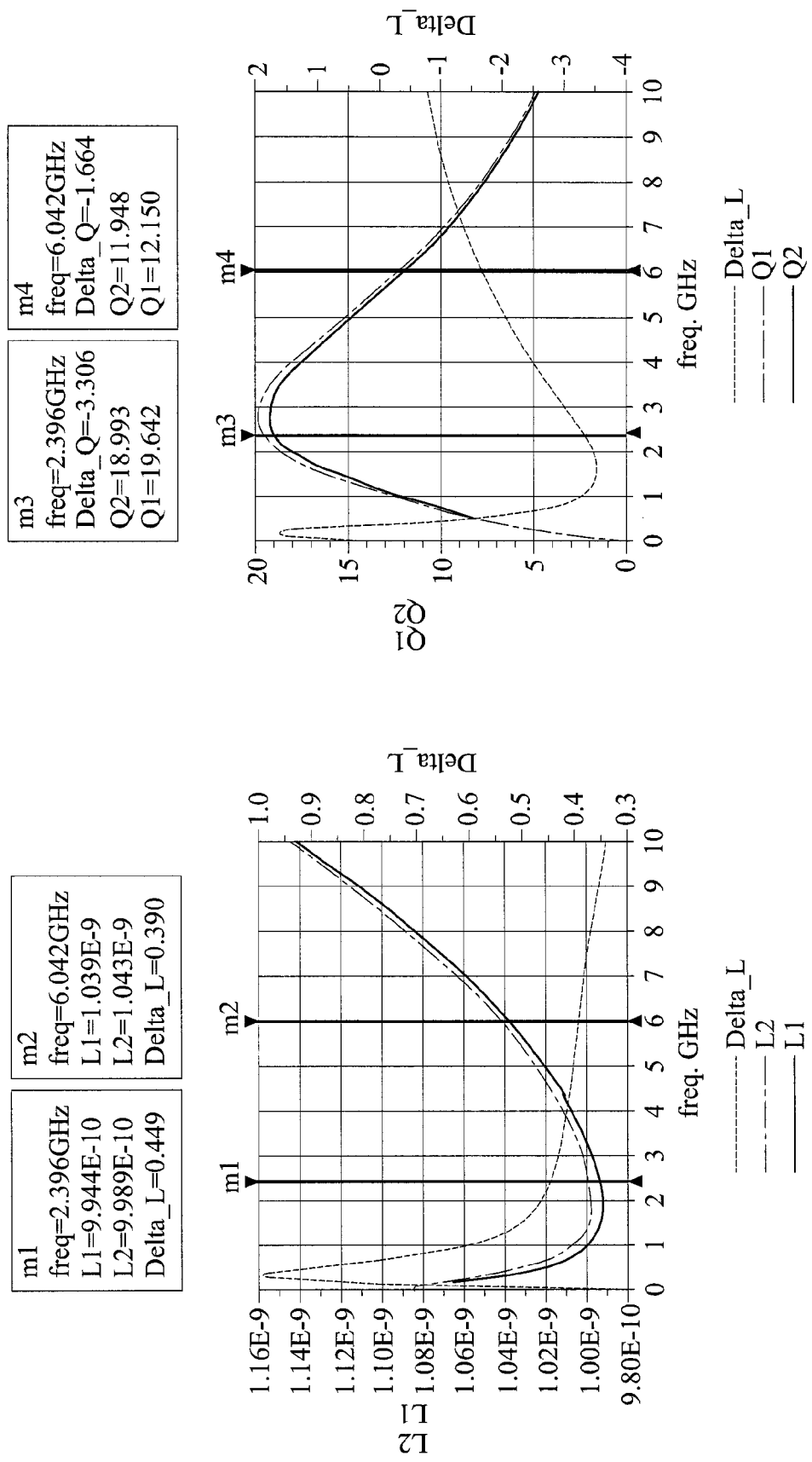
FIG. 2B shows characteristic curves of the center-tap differential inductor of FIG. 2A.
Figure 3B:
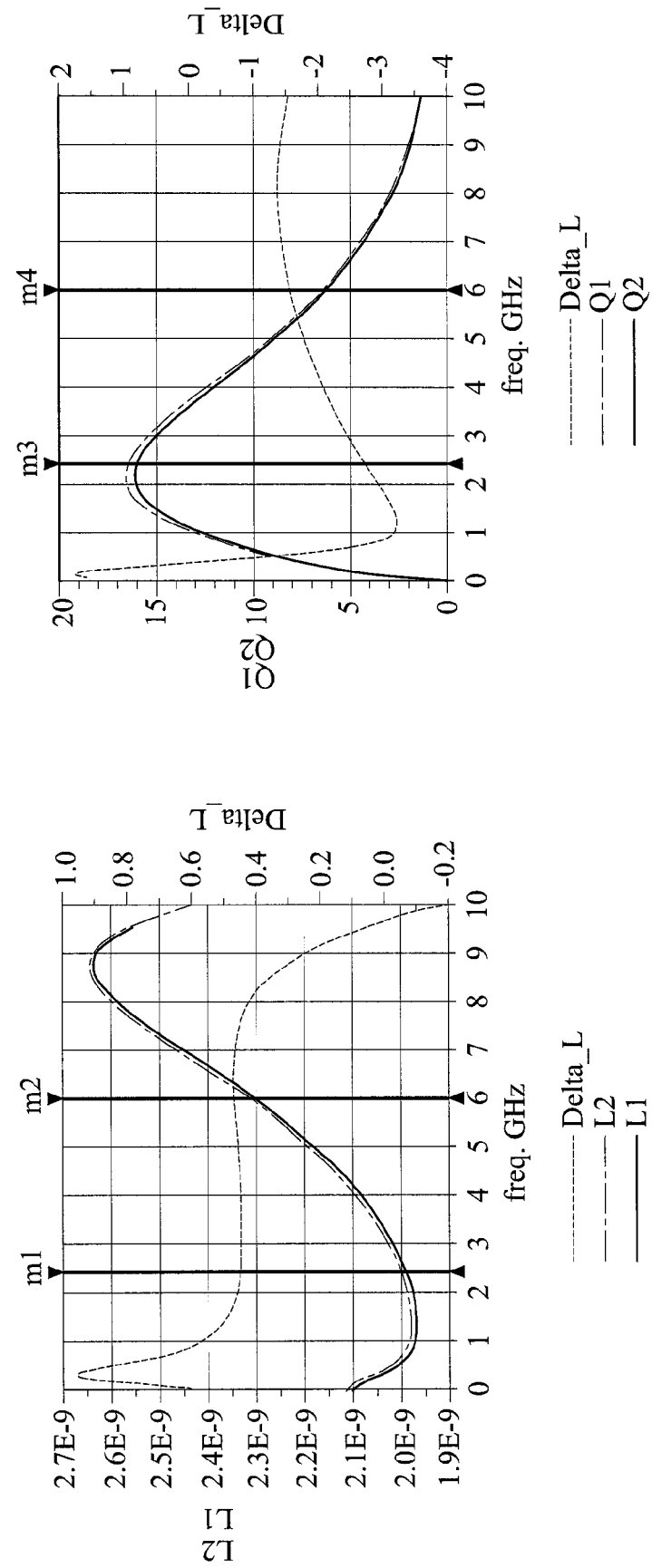
FIG. 3B shows characteristic curves of the symmetric differential inductor of FIG. 3A.

FIG. 3B shows characteristic curves of the symmetric differential inductor structure 3. Referring to FIG. 3B, at frequencies the same as those in FIGS. 1B and 2B, the symmetric differential inductor 3 has increased inductance values and quality factors and improved symmetry.

According to the present invention, the first and second spiral conductive wirings can be symmetric to each other along the centerline of the substrate, and the third and fourth spiral conductive wirings can also be symmetric to each other along the centerline of the substrate. Further, the first to fourth spiral conductive wirings are disposed at four different quadrants of the substrate so as not to overlap each other. Therefore, the present invention avoids using central conductive wirings that occupy a large area of the substrate as in the conventional symmetric and center-tap differential inductors and achieves a fully symmetric structure for the differential inductor, thereby increasing the product yield.

The above-described descriptions of the detailed embodiments are intended to illustrate the preferred implementation according to the present invention but are not intended to limit the scope of the present invention. Accordingly, many modifications and variations completed by those with ordinary skill in the art will fall within the scope of the present invention as defined by the appended claims.

What is claimed is:

1. A symmetric differential inductor structure disposed on a substrate, wherein the substrate is divided into a first quadrant, a second quadrant, a third quadrant and a fourth quadrant; a first input port is disposed in the second quadrant; a second input port is disposed in the first quadrant; and a third input port is disposed outside the first and second quadrants, the symmetric differential inductor structure comprising:

a first spiral conductive wiring disposed in the second quadrant and having a first contact connected to the first input port and a first end disposed in the first spiral conductive wiring;

a second spiral conductive wiring disposed in the first quadrant and having a second contact connected to the second input port and a second end disposed in the second spiral conductive wiring;

a third spiral conductive wiring disposed in the fourth quadrant and having a third contact connected to the third input port and a third end disposed in the third spiral conductive wiring;

a fourth spiral conductive wiring disposed in the third quadrant and having a fourth contact connected to the third input port and a fourth end disposed in the fourth spiral conductive wiring;

a fifth conductive wiring disposed over the first and fourth spiral conductive wirings for connecting the first and fourth ends; and a sixth conductive wiring disposed over the second and third spiral conductive wirings for connecting the second and third ends.

2. The structure of claim 1, wherein the first spiral conductive wiring extends from the first input port to the first end in a clockwise spiral.

3. The structure of claim 1, wherein the second spiral conductive wiring extends from the second input port to the second end in a counterclockwise spiral.

4. The structure of claim 1, wherein the third spiral conductive wiring extends from the third input port to the third end in a counterclockwise spiral.

5. The structure of claim 1, wherein the fourth spiral conductive wiring extends from the third input port to the fourth end in a clockwise spiral.

6. The structure of claim 1, wherein the third input port is located between the third quadrant and the fourth quadrant.

7. The structure of claim 1, wherein the third contact of the third spiral conductive wiring connects with the fourth contact of the fourth spiral conductive wiring.

8. The structure of claim 1, wherein the first, second, third and fourth spiral conductive wirings and the fifth and sixth conductive wirings are made of metal.

9. The structure of claim 1, wherein the first, second, third and fourth spiral conductive wirings have rounded corners.

* * * * *